(12) United States Patent
Shirai et al.

(10) Patent No.: US 8,710,735 B2
(45) Date of Patent: Apr. 29, 2014

(54) ORGANIC ELECTROLUMINESCENCE ELEMENT

(75) Inventors: Takeo Shirai, Osaka (JP); Yoshiharu Nakamura, Osaka (JP); Hitomichi Takano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/000,531

(22) PCT Filed: Feb. 10, 2012

(86) PCT No.: PCT/JP2012/053038
§ 371 (c)(1),
(2), (4) Date: Aug. 20, 2013

(87) PCT Pub. No.: WO2012/114894
PCT Pub. Date: Aug. 30, 2012

(65) Prior Publication Data
US 2013/0320841 A1 Dec. 5, 2013

(30) Foreign Application Priority Data

Feb. 22, 2011 (JP) ................. 2011-035905

(51) Int. Cl.
*H01L 23/48* (2006.01)
(52) U.S. Cl.
USPC ........................................ 313/504
(58) Field of Classification Search
CPC ........ C09K 11/06; H05B 33/26; H05B 33/28; H05B 33/06; H01L 51/5203; H01L 27/3276; H01L 27/3288; H01L 51/5212; H01L 51/5228; H01L 27/329; H01L 27/3297; H01L 21/76895; H01L 23/48
USPC ................................ 313/498–512
See application file for complete search history.

(56) References Cited

U.S. PATENT DOCUMENTS 8,283,845 B2  10/2012  Itou et al.
8,500,302 B2   8/2013  Ohta

FOREIGN PATENT DOCUMENTS

| JP | 2003-045674 | 2/2003 |
|---|---|---|
| JP | 2004-014128 | 1/2004 |
| JP | 2005-285523 | 10/2005 |
| JP | 2006-252866 | 9/2006 |
| JP | 2007-026862 | 2/2007 |
| JP | 2008-257951 | 10/2008 |
| JP | 2008-258317 | 10/2008 |
| JP | 2009-187737 | 8/2009 |
| JP | 2010-080307 | 4/2010 |
| WO | 2008/126269 | 10/2008 |

OTHER PUBLICATIONS

International Search Report (ISR) and Written Opinion in International Application No. PCT/JP2012/053038, dated May 1, 2012.

*Primary Examiner* — Donald Raleigh
(74) *Attorney, Agent, or Firm* — Greenblum & Bernstein, P.L.C.

(57) ABSTRACT

The organic electroluminescent device includes: a first electrode of conductive and light transmissive material; a light emitting layer of organic material on the first electrode; a second electrode of conductive material on the layer; first and second terminal parts placed on first and second ends of the layer in a first direction crossing a thickness direction of the layer and coupled to the first and second electrodes, respectively; and an auxiliary electrode which is on the first electrode and beside the layer in a second direction crossing the thickness direction and the first direction and coupled to the first electrode, and has an elongated shape extending in the first direction, and made of material having specific resistance smaller than the first electrode, and includes portions with different thicknesses such that sheet resistance is increased with an increase in distance from the first terminal part in a lengthwise direction thereof.

6 Claims, 5 Drawing Sheets

(a)

(b)

(c)

(a)

(b)

(c)

ORGANIC ELECTROLUMINESCENCE ELEMENT

TECHNICAL FIELD

The present invention relates to organic electroluminescence elements (organic EL elements).

BACKGROUND ART

To light up an organic electroluminescence element at high luminance, a flow of a greater current is necessary. However, with regard to the organic EL element, in general, an anode formed of an ITO film has a sheet resistance higher than a sheet resistance of a cathode which may be formed of a metal film, an alloy film, or a metal compound film. Hence, this causes an increase in a potential gradient, and such an increase is likely to cause an increase in an in-plane variation of luminance.

In order to solve this problem, in the past, there has been proposed an organic electroluminescence element as shown in FIGS. 5(a) and (b) (document 1 [JP 2003-45674 A]). This organic electroluminescence element includes an anode 102, an organic light emitting layer 103, auxiliary electrodes 105, and a cathode 104. The anode 102 is formed on a transparent substrate 100 and is made of an ITO film. The organic light emitting layer 103 is formed on the anode 102. The auxiliary electrode 105 is formed on the anode 102, and is spaced away from the organic light emitting layer 103 at a predetermined interval. The cathode 104 is formed on the organic light emitting layer 103. In this organic electroluminescence element, light is produced in the organic light emitting layer 103 when a voltage is applied between the anode 102 and the cathode 103, and is emitted outside via the anode 102 and the transparent substrate 100.

As described in document 1, according to the organic electroluminescence element disclosed in document 1, with providing the auxiliary electrode 105, it is possible to suppress a voltage drop and generation of heat at the anode 102, and further to improve the efficiency and the luminance.

However, in the organic electroluminescence element disclosed in document 1, presence of the auxiliary electrode 105 causes an increase in an area of the non-light emission part, and such an increase may cause a decrease in an area of a light emission part defined as an overlap between the transparent substrate 100, the anode 102, the organic light emitting layer 103, and the cathode 104. In other words, in the organic electroluminescence element disclosed in document 1, the non-light emission part defined as a part other than the light emission part has an increased area. Additionally, in the aforementioned organic electroluminescence element, since the auxiliary electrode 105 has a constant width, a magnitude of a flowing current is increased at a portion of the auxiliary electrode 105 closer to a terminal part of the anode 102 (left end part of the anode 102 in FIG. 5) in a lengthwise direction of the auxiliary electrode 105 (i.e., a magnitude of a current flowing through the auxiliary electrode 105 is decreased with an increase in a distance from the terminal part of the anode 102). Hence, in the aforementioned organic electroluminescence element, a voltage drop per unit length of the auxiliary electrode 105 is increased with a decrease in a distance from the terminal part of the anode 102, and is decreased with an increase in the distance from the terminal part. Therefore, unevenness of luminance is likely to occur.

SUMMARY OF INVENTION

In view of the above insufficiency, the present invention has aimed to propose an organic electroluminescence element capable of decreasing the area of the non-light emission part yet suppressing unevenness of luminance.

The organic electroluminescence element of the first aspect in accordance with the present invention includes a first electrode, a light emitting layer, a second electrode, a first terminal part, a second terminal part, and an auxiliary electrode. The first electrode is made of an electrically conductive and light transmissive material. The light emitting layer is formed on the first electrode by use of an organic material. The second electrode is formed on the light emitting layer by use of an electrically conductive material. The first terminal part is placed on a first end of the light emitting layer in a first direction crossing a thickness direction of the light emitting layer and is electrically coupled to the first electrode. The second terminal part is placed on a second end of the light emitting layer in the first direction and is electrically coupled to the second electrode. The auxiliary electrode is formed on the first electrode so as to be located beside the light emitting layer in a second direction crossing the thickness direction and the first direction and is electrically coupled to the first electrode. The auxiliary electrode is formed into an elongated shape extending in the first direction by use of a material having a specific resistance smaller than that of the first electrode. The auxiliary electrode includes plural portions with different thicknesses such that a sheet resistance is increased with an increase in a distance from the first terminal part in a lengthwise direction of the auxiliary electrode.

With regard to the organic electroluminescence element of the second aspect in accordance with the present invention, in the first aspect, the auxiliary electrode is constituted by plural auxiliary electrode layers having different lengths, the plural auxiliary electrode layers being stacked on the first electrode in descending order of length while ends of the plural auxiliary electrode layers close to the first terminal part are aligned with each other.

With regard to the organic electroluminescence element of the third aspect in accordance with the present invention, in the first or second aspect, the plural portions are arranged from the first terminal part to the second terminal part in descending order of thickness.

With regard to the organic electroluminescence element of the fourth aspect in accordance with the present invention, in any one of the first to third aspects, lengths and thicknesses of the plural portions are selected such that inclination of a voltage of the auxiliary electrode to a distance from the first terminal part is kept constant.

DESCRIPTION OF EMBODIMENTS (First Embodiment)

Figure 1:
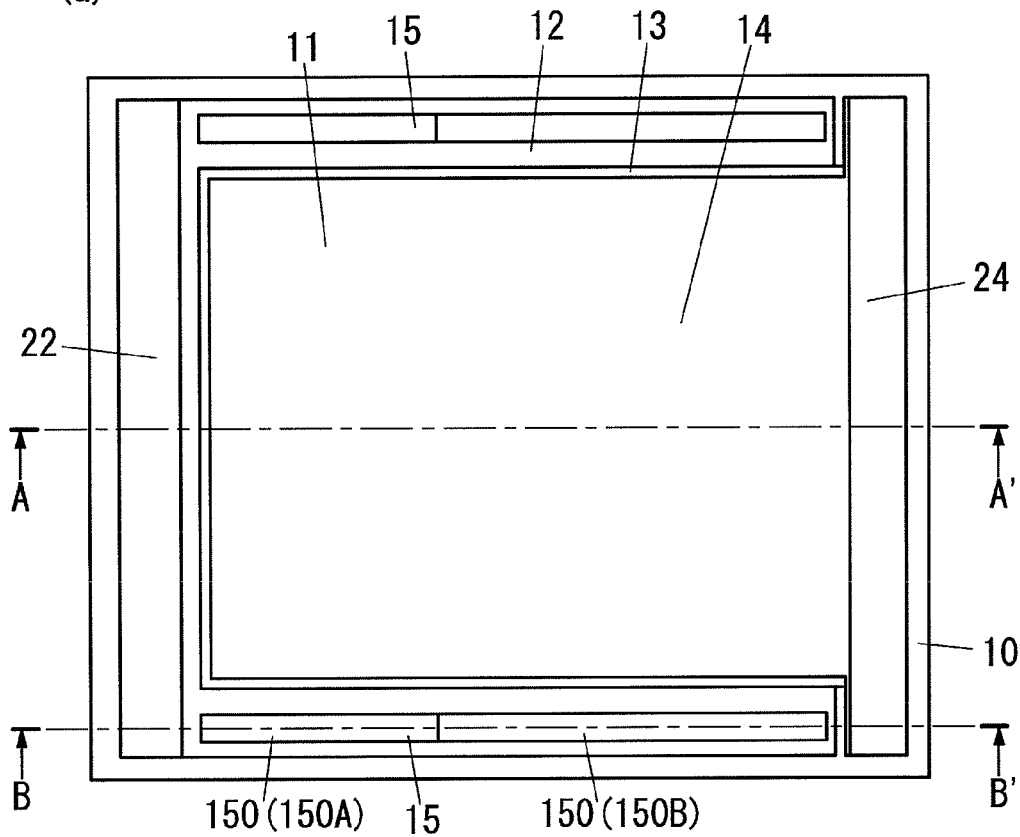
FIG. 1 relates to the organic electroluminescence element of the first embodiment, and shows (a) a schematic plan view thereof, (b) a schematic sectional view along line A-A' in (a), and (c) a schematic sectional view along line B-B' in (a)
Figure 1:
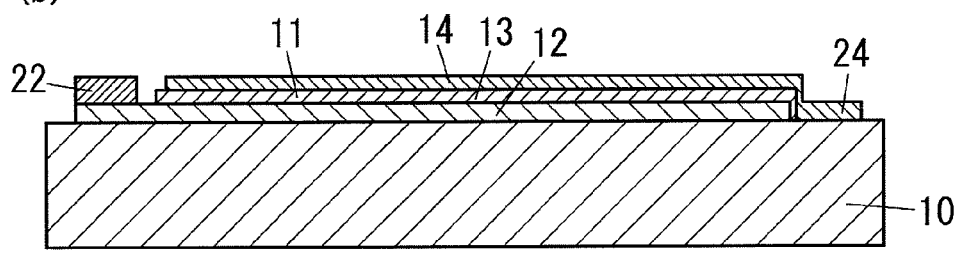
Figure 1:
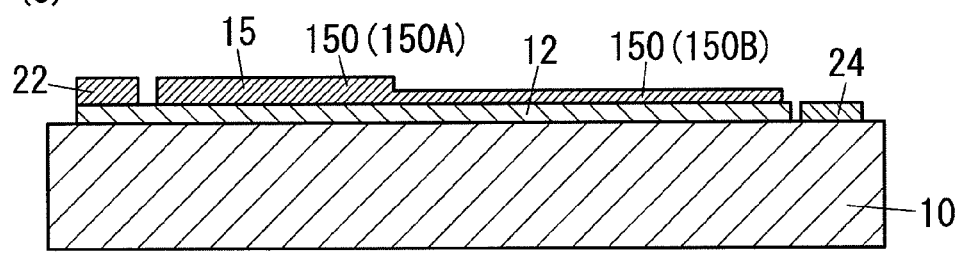

The following explanation referring to FIG. 1 is made to the organic electroluminescence element (hereinafter, referred to as "organic EL element") of the present embodiment.

The organic EL element of the present embodiment includes a first electrode 12 and a second electrode 14. The first electrode 12 is formed of a transparent conductive film. The second electrode 14 is spaced away from the first electrode 12 in a thickness direction of the first electrode 12. The second electrode 14 has a sheet resistance smaller than that of the first electrode 12. There is an organic EL layer 13 interposed between the first electrode 12 and the second electrode 14. The organic EL layer 13 includes a light emitting layer made of an organic material.

Further, the organic EL element includes a first terminal part 22 and a second terminal part 24. The first terminal part 22 is formed beside a light emission part 11 defined as an overlap between the first electrode 12, the light emitting layer, and the second electrode 14. The first terminal part 22 is electrically coupled to the first electrode 12. The second terminal part 24 is formed on an opposite side of the light emission part 11 from the first terminal part 22, and is beside the light emission part 11. The second terminal part 24 is electrically coupled with the second electrode 14.

Furthermore, the organic EL element includes auxiliary electrodes 15. The auxiliary electrode 15 is made of a material having a lower specific resistance than that of the first electrode 12. The auxiliary electrode 15 is stacked on the first electrode 12 so as to be beside the light emission part 11. The auxiliary electrode 15 is electrically coupled to the first terminal part 22.

Moreover, in the organic EL element, the first electrode 12 is stacked (directly or indirectly) on a first surface (upper surface in FIG. 1(b)) of a substrate 10. The second electrode 14 is located on an opposite side of the first electrode 12 from the substrate 10 and faces the first electrode 12. As the substrate 10, a light-transmissive (transparent or translucent) substrate is used. Hence, the organic EL element is able to emit light via a second surface (lower surface in FIG. 1(b)) of the substrate 10.

Note that, in the organic EL element of the present embodiment, the second electrode 14 is defined as an electrode that reflects light from the light emitting layer. In brief, the second electrode 14 is designed to reflect light from the light emitting layer. Additionally, in the organic EL element, a region of the second surface of the substrate 10 corresponding to a projection of an overlap between three of the first electrode 12, the organic EL layer 13, and the second electrode 14 defines a light emitting surface.

The following detailed explanations are made to respective components of the organic EL element.

The substrate 10 has a rectangular-like shape in a plan view. The substrate 10 may have a rectangular or square shape, as long as it has a rectangular-like shape.

As the substrate 10, a glass substrate is used. However, a plastic substrate may be used. Such a glass substrate may be selected from an alkali-free glass substrate and a soda-lime glass substrate. Alternatively, such a plastic substrate may be selected from a polyethylene terephthalate (PET) substrate, a polyethylene naphthalate (PEN) substrate, a polyethersulfone (PES) substrate, and a polycarbonate (PC) substrate.

In a case where a glass substrate is used as the substrate 10, unevenness of the first surface of the substrate 10 may cause a leakage current in the organic EL element (may cause deterioration of the organic EL element). Therefore, in the case where a glass substrate is used as the substrate 10, it is necessary to prepare a glass substrate for forming the element that is highly precisely polished such that the surface roughness of the first surface is reduced.

Note that it is preferable that with regard to the surface roughness of the first surface of the substrate 10, the arithmetic average roughness Ra defined in JIS B 0601-2001 (ISO 4287-1997) is several nm or less. In contrast, when a plastic substrate is used as the substrate 10, it is possible to obtain a substrate whose arithmetic average roughness Ra of the first surface is several nm or less at low cost even if highly precise polishing is not particularly performed.

In the organic EL element, the first electrode 12 serves as an anode, and the second electrode 14 serves as a cathode. Further, in the organic EL element, the organic EL layer 13 interposed between the first electrode 12 and the second electrode 14 includes a hole transport layer, the aforementioned light emitting layer, an electron transport layer, and an electron injection layer in this order from the first electrode 12.

In the organic EL element, the light emission part 11 is defined by a region corresponding to an overlap between the substrate 10, the first electrode 12, the aforementioned light emitting layer, and the second electrode 14, and a region of the organic EL element other than the light emission part defines a non-light emission part.

In other words, the light emission part 11 is constituted by: a part of the first electrode 12 which covers the light emitting layer (organic EL layer) 13 and the second electrode 14; a part of the light emitting layer which covers the first electrode 12 and the second electrode 14; and a part of the second electrode 14 which covers the light emitting layer and the first electrode 12.

The aforementioned layered structure of the organic EL layer 13 is not limited to the above instance, but may be selected from a single layer structure of the light emitting layer, a layered structure of the hole transport layer, the light emitting layer, and the electron transport layer, a layered structure of the hole transport layer and the light emitting layer, and a layered structure of the light emitting layer and the electron transport layer. Additionally, a hole injection layer may be interposed between the first electrode 12 and the hole transport layer.

Besides, the light emitting layer may have a single layer structure or a multilayer structure. For example, in a case where the desired color of emitted light is white, the light emitting layer may be doped with three types of dopant pigments (red, green and blue), a layered structure of a blue hole transporting light emitting layer, a green electron transporting light emitting layer and a red electron transporting light emitting layer may be adopted, or a layered structure of a blue electron transporting light emitting layer, a green electron transporting light emitting layer and a red electron transporting light emitting layer may be adopted.

Besides, the organic EL layer having a function of emitting light when voltage is applied between the first electrode 12 and the second electrode 14 that holds the organic EL layer 13 therebetween can be treated as a single light emitting unit. In this case, a multiunit structure may be adopted. The multiunit structure is a structure in which plural light emitting units are stacked while intermediate layers having light transparency and electrical conductivity are interposed therebetween and are electrically connected in series (that is, a structure in which plural light emitting units that are overlaid in the thickness direction are provided between one first electrode 12 and one second electrode 14).

The first electrode 12 is formed directly or indirectly on the first surface of the substrate 10. The first electrode 12 serving as an anode is an electrode for injecting holes into the light emitting layer. It is preferable to use electrode material including metal, alloy or an electrically conductive compound that has a large work function, or a mixture thereof. Further, it is preferable to use electrode material having a work function of 4 eV or more to 6 eV or less so that a difference between HOMO (highest occupied molecular orbital) level and the work function of the first electrode 12 is not significantly increased.

Examples of such electrode material for the first electrode 12 include ITO (Indium Tin Oxide), tin oxide, zinc oxide, IZO (Indium Zinc Oxide) and copper iodide, conductive polymers (e.g., PEDOT and polyaniline), conductive polymers that are doped with any acceptor or the like, and conductive light-transmissive material (e.g., carbon nanotube). In this regard, the first electrode 12 may be formed on or over the first surface of the substrate 10 as a thin film by means of a sputtering method, a vacuum vapor deposition method, a coating method, for example.

Note that, it is preferable that the sheet resistance of the first electrode 12 be several hundreds $\Omega/\square$ or less, and it is particularly preferable that it be $100\Omega/\square$ or less. Although the film thickness of the first electrode 12 may change depending on the light transmittance and the sheet resistance of the first electrode 12, it is favorable to set the film thickness thereof to be less than or equal to 500 nm, preferably to be set in a range of 10 nm to 200 nm.

The second electrode 14 is formed directly or indirectly on the light emitting layer (organic EL layer 13). The second electrode 14 serving as the cathode is an electrode for injecting electrons into the light emitting layer. It is preferable to use electrode material including metal, alloy or an electrically conductive compound that has a small work function, or a mixture thereof. Further, it is preferable to use electrode material having a work function of 1.9 eV or more to 5 eV or less so that a difference between LUMO (lowest unoccupied molecular orbital) level and the work function of the second electrode 14 is not significantly increased.

Examples of electrode material for the second electrode 14 include aluminum, silver, magnesium, gold, copper, molybdenum, palladium, tin, and the like, and an alloy of these and another metal, for example, magnesium-silver mixture, magnesium-indium mixture, and aluminum-lithium alloy.

Alternatively, it is possible to use a laminated layer of an ultrathin film and a thin film made of aluminum. Such an ultrathin film may be made of electrically conductive material made of metal, metal oxide or the like, or a mixture of these and another metal, for example, aluminum oxide. In this regard, such an ultrathin film may be defined as a thin film of 1 nm or less that is capable of allowing electrons to flow by tunnel injection.

As material for the light emitting layer, it is possible to use any material that is known as material for an organic EL element. Examples thereof may include anthracene, naphthalene, pyrene, tetracene, coronene, perylene, phthaloperylene, naphthaloperylene, diphenyl butadiene, tetraphenyl butadiene, coumarin, oxadiazole, bisbenzoxazoline, bisstyryl, cyclopentadiene, quinoline metal complex, tris(8-hydroxyquinolinato)aluminum complex, tris(4-methyl-8-quinolinato)aluminum complex, tris(5-phenyl-8-quinolinato)aluminum complex, aminoquinoline metal complex, benzo quinoline metal complex, tri-(p-terphenyl-4-yl)amine, 1-aryl-2,5-di(2-thienyl)pyrrole derivatives, pyran, quinacridone, rubrene, distyryl benzene derivatives, distyryl arylene derivatives, distyryl amine derivatives, various types of fluorescent pigments, and the derivatives thereof, but are not limited thereto.

Alternatively, it is preferable that luminescent materials selected from these compounds be mixed and used as appropriate. Moreover, it is also possible to preferably use not only compounds typified by the above-described compounds that cause fluorescence but also material that emits light from spin multiplet, for example, phosphorescent material that causes phosphorescence, and compounds having a site constituted by them in a portion of a molecule.

Besides, the light emitting layer made of these materials may be formed into a film by a dry process (e.g., a vapor deposition method and a transfer method), or may be formed into a film by a wet process (e.g., a spin coating method, spray coating method, dye coating method, and gravure printing method).

Material used for the above-described hole injection layer can be formed by using organic material and metal oxide that allow hole injection, that is, a so-called acceptor-based organic material or inorganic material, p-doped layer and the like.

Organic material that allows hole injection is capable of transporting holes, and has a work function of about 5.0 to 6.0 eV, and examples thereof may include material that exhibits strong adherence with the first electrode 12, for example, CuPc and starburst amine.

Further, a metal oxide that allows hole injection is a metal oxide containing any of, for example, molybdenum, rhenium, tungsten, vanadium, zinc, indium, tin, gallium, titanium, and aluminum. Moreover, a metal oxide may be not only an oxide of only one type of metal but also an oxide of plural types of metal containing any metal described above, such as indium and tin, indium and zinc, aluminum and gallium, gallium and zinc, titanium and niobium.

Besides, a hole injection layer made of these materials may be formed into a film by a dry process (e.g., a vapor deposition method and a transfer method), or may be formed into a film by a wet process (e.g., a spin coating method, spray coating method, dye coating method, and gravure printing method).

Also, material used for the hole transport layer can be selected from, for example, the group of compounds that allow hole transport. Examples of such types of compounds may include arylamine-based compounds, amine compounds containing a carbazole group, amine compounds containing fluorene derivatives and the like, such as 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4''-tris(N-(3-methylphenyl)N-phenylamino)triphenylamine (MTDATA), 4,4'-N,N'-dicarbazole biphenyl (CBP), spiro-NPD, spiro-TPD, spiro-TAD, TNB and the like as representative examples, and any hole transport material that is generally known can be used.

Material used for the electron transport layer can be selected from the group of compounds that allow electron transport. Examples of such types of compounds may include a metal complex that is known as electron transporting material (e.g., $Alq_3$), and compounds having a heterocycle (e.g., phenanthroline derivatives, pyridine derivatives, tetrazine derivatives, and oxadiazole derivatives), but are not limited thereto, and any electron transport material that is generally known can be used.

Material for the electron injection layer can be arbitrarily selected from, for example, metal fluorides (e.g., lithium fluoride and magnesium fluoride), metal halide compounds (e.g., metal chlorides typified by sodium chloride and magnesium chloride), oxides, nitrides, carbides, oxynitrides and the like of various types of metals (e.g., aluminum, cobalt, zirconium, titanium, vanadium, niobium, chromium, tantalum, tungsten, manganese, molybdenum, ruthenium, iron, nickel, copper, gallium, zinc, and silicon), for example, aluminum oxide, magnesium oxide, iron oxide, aluminum nitride, silicon nitride, silicon carbide, silicon oxynitride, and boron nitride serving as insulating material, silicon compounds (e.g., $SiO_2$ and SiO), and carbon compounds. These materials can be formed into a thin film shape by a vacuum vapor deposition method, or a sputtering method, for example.

The first terminal part 22 is formed into an elongated shape extending in a width direction (upward and downward direction in FIG. 1(a)) of the light emitting layer. In the present embodiment, the first terminal part 22 is formed directly on the first electrode 12 and is electrically coupled with the first electrode 12.

As shown in FIG. 1(a), the first terminal part 22 is placed on a first end of the light emitting layer in a first direction crossing a thickness direction (upward and downward direction in FIG. 1(b)) of the light emitting layer. In the present embodiment, the first direction is perpendicular to the thickness direction of the light emitting layer. For example, the first direction is identical to a lengthwise direction (left and right direction in FIG. 1(a)) of the light emitting layer. In other words, the first terminal part 22 is located on the first end (left end in FIG. 1(a)) of the light emitting layer in the lengthwise direction of the light emitting layer.

It is preferable that the first terminal part 22 be made of material having a smaller specific resistance than that for the first electrode 12. Preferably, examples of material for the first terminal part 22 include metal such as gold, silver, copper, chromium, molybdenum, aluminum, palladium, tin, lead, and magnesium, and an alloy of at least one of these. Note that, the structure of the first terminal part 22 is not limited to a single layer structure but may be a multilayer structure.

The second terminal part 24 is formed into an elongated shape extending in the width direction of the light emitting layer. The second terminal part 24 is formed directly or indirectly on the substrate 10. In the present embodiment, the second terminal part 24 is formed integrally with the second electrode 14 and is electrically coupled with the second electrode 14.

As shown in FIG. 1(a), the second terminal part 24 is placed on a second end of the light emitting layer in the first direction crossing the thickness direction of the light emitting layer. In other words, the second terminal part 24 is located on the second end (right end in FIG. 1(a)) of the light emitting layer in the lengthwise direction of the light emitting layer. Hence, the first terminal part 22 and the second terminal part 24 face each other in the lengthwise direction of the light emitting layer. The second terminal part 24 has a length substantially equal to that of the first terminal part 22.

The second terminal part 24 is made of the same material as the second electrode 14. In the present embodiment, the second electrode 14 has an extended part which extends on the substrate 10, and this extended part serves as the second terminal part 24. However, the second terminal part 24 may be formed directly or indirectly on this extended part. In this case, the second terminal part 24 is made of material similar to material for the first terminal part 22.

The auxiliary electrode 15 is formed directly or indirectly on the first electrode so as to be located beside the light emitting layer in a second direction crossing the thickness direction and the first direction (lengthwise direction). Further, the auxiliary electrode 15 is interposed between the first terminal part 22 and the second terminal part 24 in the lengthwise direction of the light emitting layer. The auxiliary electrode 15 is formed directly on the first electrode 12 and is electrically coupled to the first electrode 12.

In the present embodiment, the second direction is respectively perpendicular to the thickness direction of the light emitting layer and the first direction. For example, the second direction is identical to the width direction (upward and downward direction in FIG. 1(a)) of the light emitting layer. In brief, the auxiliary electrode 15 is positioned beside the light emitting layer in the width direction of the light emitting layer.

The organic EL element of the present embodiment includes the two auxiliary electrodes 15. The two auxiliary electrodes 15 are positioned on respective opposite sides (upper and lower sides in FIG. 1(a)) of the light emitting layer in the width direction of the light emitting layer.

It is preferable that the auxiliary electrode 15 be made of material having a smaller specific resistance than that for the first electrode 12. Preferably, examples of material for the auxiliary electrode 15 include metal such as gold, silver, copper, chromium, molybdenum, aluminum, palladium, tin, lead, and magnesium, and an alloy of at least one of these.

Note that, the structure of the auxiliary electrode 15 is not limited to a single layer structure but may be a multilayer structure. When the auxiliary electrode 15 and the first terminal part 22 are made of the same material, it is possible to form the auxiliary electrode 15 and the first terminal part 22 simultaneously, and a production cost can be reduced.

Besides, in the organic EL element of the present embodiment, the first electrode 12 has a rectangular-like shape when viewed in a plan view, and peripheral directions of the light emission part 11 and the first electrode 12 extend collaterally. Additionally, the auxiliary electrode 15 is placed along part of the peripheral direction of the light emission part 11.

Concretely, the first terminal part 12 is placed along a certain side of the first electrode 12 beside the periphery of the first electrode 12 formed into a rectangular-like shape, and the auxiliary electrodes 15 are respectively placed along two sides adjacent to the certain side of the first electrode 12 beside the periphery of the first electrode 12. Alternatively, the first terminal part 22 and the respective auxiliary electrodes 15 may be provided as a single part.

The auxiliary electrode 15 is formed into an elongated shape extending in the first direction (lengthwise direction of the light emitting layer in the present embodiment) by use of a material having a specific resistance smaller than that of the first electrode 12. Additionally, the auxiliary electrode 15 has a constant width. The auxiliary electrode 15 is placed such that the auxiliary electrode 15 faces the light emitting layer and is away from the light emitting layer at a predetermined interval. The auxiliary electrode 15 has a length substantially equal to that of the light emitting layer.

With regard to the auxiliary electrode 15, the width is kept constant, and the thickness is varied such that the sheet resistance of a part is increased as the part is further away from the first terminal part 22 in the peripheral direction of the light emission part 11. Note that, in the instance shown in FIG. 1, the thickness of the auxiliary electrode 15 is varied one time in a stepwise manner.

In other words, the auxiliary electrode 15 includes plural portions 150 with different thicknesses such that a sheet resistance is increased with an increase in a distance from the first terminal part 22 in a lengthwise direction of the auxiliary electrode 15. In the present embodiment, the auxiliary electrode 15 includes the two portions 150A and 150B. Hence, the auxiliary electrode 15 has a different sheet resistance for each portion 150.

The portion (first portion) 150A of the auxiliary electrode 15 is closer to the first terminal part 22 in the lengthwise direction of the auxiliary electrode 15 than the portion (second portion) 150B is. Further, the first portion 150A has the thickness greater than that of the second portion 150B. In brief, the plural portions 150A and 150B are arranged from the first terminal part 22 to the second terminal part 24 in descending order of thickness.

Note that, the lengths and thicknesses of the plural portions 150 of the auxiliary electrode 15 are selected such that inclination of a voltage of the auxiliary electrode 15 (a voltage developed at the auxiliary electrode 15 when a driving voltage is applied between the first terminal part 22 and the second terminal part 24) to the distance from the first terminal part 22 is kept constant.

For example, the thicknesses of the first portion 150A and the second portion 150B are selected such that the sheet resistance of the first portion 150A is about hundred times greater than that of the second portion 150B. Further, the first portion 150A has the length shorter than that of the second portion 150B.

Figure 2:
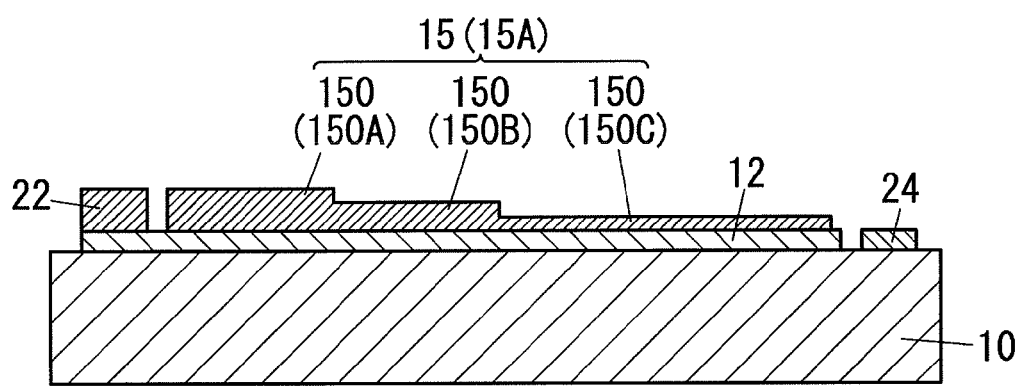
FIG. 2 is a schematic section view illustrating a modification of the organic electroluminescence element of the first embodiment.

FIG. 2 shows a modification of the organic EL element of the present embodiment. The modification shown in FIG. 2 is different from the organic EL element shown in FIG. 1 in the auxiliary electrode 15 (15A). The auxiliary electrode 15A includes the three portions 150 (the first portion 150A, the second portion 150B, and the third portion 150C) with the different thicknesses.

The first portion 150A is closer to the first terminal part 22 in the lengthwise direction of the auxiliary electrode 15A than the second portion 150B is. Further, the first portion 150A is thicker than the second portion 150B. The first portion 150A is shorter than the second portion 150B.

The second portion 150B is closer to the first terminal part 22 in the lengthwise direction of the auxiliary electrode 15 than the third portion 150C is. Further, the second portion 150B is thicker than the third portion 150C. The second portion 150B is shorter than the third portion 150C.

In this manner, the plural portions 150A, 150B, and 150C are arranged from the first terminal part 22 to the second terminal part 24 in descending order of thickness.

The lengths and thicknesses of the plural portions 150 (150A, 150B, and 150C) of the auxiliary electrode 15A are selected such that the inclination of the voltage of the auxiliary electrode 15A (the voltage developed at the auxiliary electrode 15A when the driving voltage is applied between the first terminal part 22 and the second terminal part 24) to the distance from the first terminal part 22 is kept constant.

How to vary the thickness of the auxiliary electrode 15 is not limited to the aforementioned manner. The thickness of the auxiliary electrode 15 may be varied plural times in a stepwise manner, or may be varied in a linear manner. For example, the auxiliary electrode 15 may include the four or more portions 150. The auxiliary electrode 15 may be formed by means of a sputtering method, a plating method or a vapor deposition method.

The organic EL element of the present embodiment described above includes: the first electrode 12 formed of a transparent conductive film; and the second electrode 14 placed away from the first electrode 12 in the thickness direction of the first electrode 12 and having the sheet resistance smaller than that of the first electrode 12. Further, the organic EL element includes the light emitting layer (organic EL layer 13) which is made of organic material and is interposed between the first electrode 12 and the second electrode 14. The organic EL element of the present embodiment includes the first terminal part 22, the second terminal part 24, and the auxiliary electrodes 15 and 15. The first terminal part 12 is placed beside the light emission part 11 defined as an overlap between the first electrode 12, the light emitting layer, and the second electrode 14, and is electrically coupled to the first electrode 12. The second terminal part 24 is placed beside the light emission part 11 in the opposite side of the light emitting part 11 from the first terminal part 22, and is electrically coupled to the second electrode 14. The auxiliary electrode 15 is made of a material having a specific resistance smaller than that for the first electrode 12. The auxiliary electrode 15 is stacked on the first electrode 12 to be beside the light emission part 11, and is electrically coupled to the first terminal part 22. The auxiliary electrode 15 is located along the peripheral direction of the light emission part 11. The auxiliary electrode 15 has the thickness which is varied such that the sheet resistance at a part is increased as the part is further away from the first terminal part 22 in the peripheral direction.

In other words, the organic EL element of the present embodiment includes the first electrode 12, the light emitting layer (the organic EL layer 13 including the light emitting layer), the second electrode 14, the first terminal part 22, the second terminal part 24, and the auxiliary electrode 15. The first electrode 12 is made of an electrically conductive and light transmissive (transparent or translucent) material. The light emitting layer is formed directly or indirectly on the first electrode 12 by use of an organic material. The second electrode 14 is formed directly or indirectly on the light emitting layer by use of an electrically conductive material. The first terminal part 22 is placed on the first end (left end in FIG. 1(a)) of the light emitting layer in the first direction (left and right direction in FIG. 1(a)) crossing the thickness direction of the light emitting layer and is electrically coupled to the first electrode 12. The second terminal part 24 is placed on the second end (right end in FIG. 1(a)) of the light emitting layer in the first direction and is electrically coupled to the second electrode 14. The auxiliary electrode 15 is formed directly or indirectly on the first electrode 12 so as to be located beside the light emitting layer in the second direction (upward and downward direction) crossing the thickness direction and the first direction and is electrically coupled to the first electrode 12. The auxiliary electrode 15 is formed into an elongated shape extending in the first direction by use of a material having a specific resistance smaller than that of the first electrode 12. The auxiliary electrode 15 includes the plural portions 150 with different thicknesses such that the sheet resistance is increased with an increase in the distance from the first terminal part 22 in the lengthwise direction of the auxiliary electrode 15.

In the organic EL element of the present embodiment, the plural portions 150 are arranged from the first terminal part 22 to the second terminal part 24 in descending order of thickness.

In the organic EL element of the present embodiment, the lengths and thicknesses of the plural portions 150 are selected such that the inclination of the voltage of the auxiliary electrode 15 (the voltage developed at the auxiliary electrode 15 when the driving voltage is applied between the first terminal part 22 and the second terminal part 24) to the distance from the first terminal part 22 is kept constant.

In the organic EL element of the present embodiment mentioned above, the auxiliary electrode 15 has the constant width, and the thickness of the auxiliary electrode 15 is varied such that the seat resistance at a part is increased as the part is further away from the first terminal part 22 in the peripheral direction of the light emission part 11. Hence, in contrast to a case where the auxiliary electrode 15 has the constant thickness, a voltage drop per unit length (e.g., 1 cm) at a portion of the auxiliary electrode 15 close to the first terminal part 22 can be decreased while a voltage drop per unit length at a portion of the auxiliary electrode 15 away from the first terminal part 22 can be increased. Accordingly, the organic EL element of the present embodiment can suppress unevenness of luminance as well as can decrease the width of the auxiliary electrode 15. In other words, the organic EL element of the present embodiment is capable of decreasing the area of the non-light emission part yet suppressing unevenness of luminance. Note that, the luminance of the organic EL element is approximately proportional to a magnitude of a current flowing through the organic EL element.

Further, the organic EL element of the present embodiment includes the aforementioned auxiliary electrode 15. Hence, it is possible to suppress concentration of a current at a portion of the light emission part 11 close to the first terminal part 22 which would otherwise occur when the organic EL element is driven. Consequently, the life time of the organic EL element can be more prolonged.

(Second Embodiment)

Figure 3:
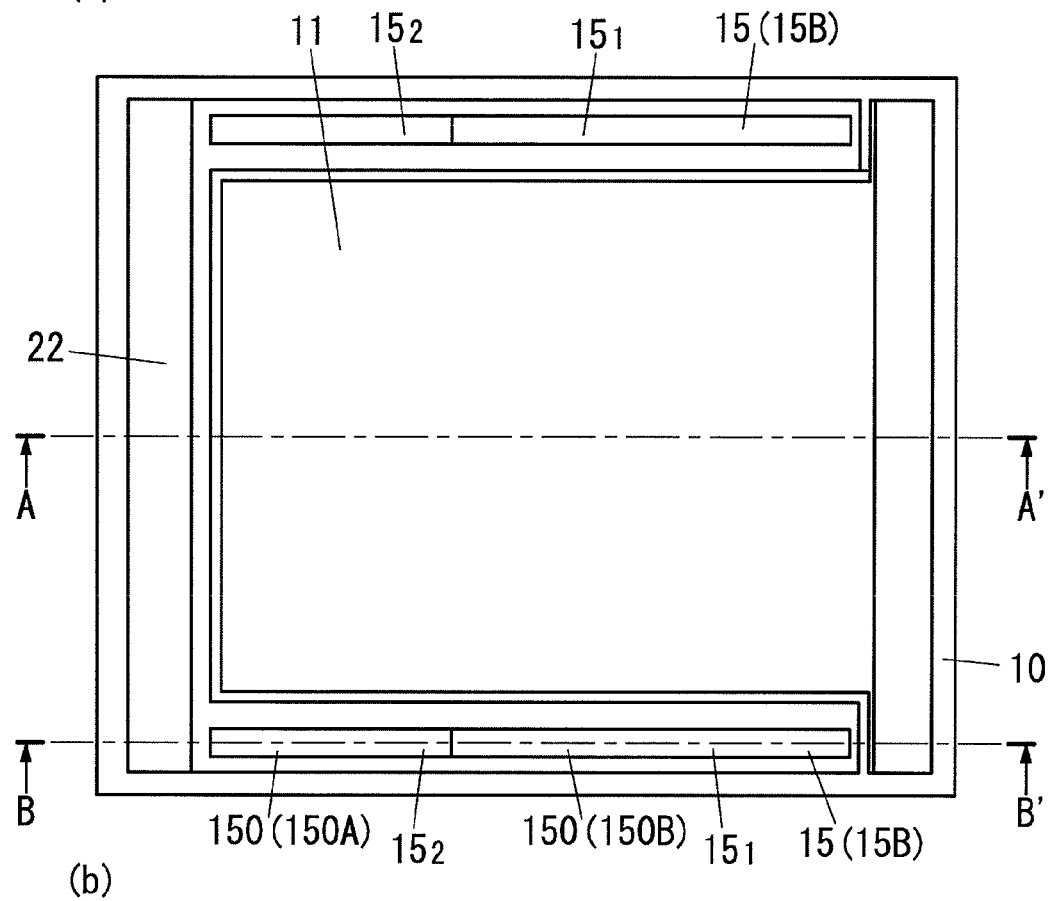
FIG. 3 relates to the organic electroluminescence element of the second embodiment, and shows (a) a schematic plan view thereof, (b) a schematic sectional view along line A-A' in (a), and (c) a schematic sectional view along line B-B' in (a)
Figure 3:
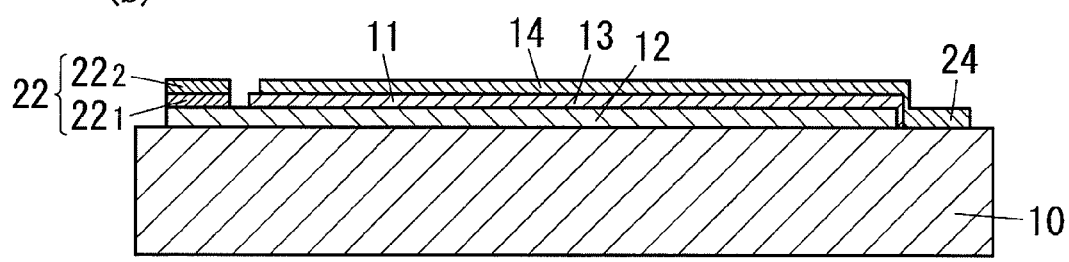
Figure 3:
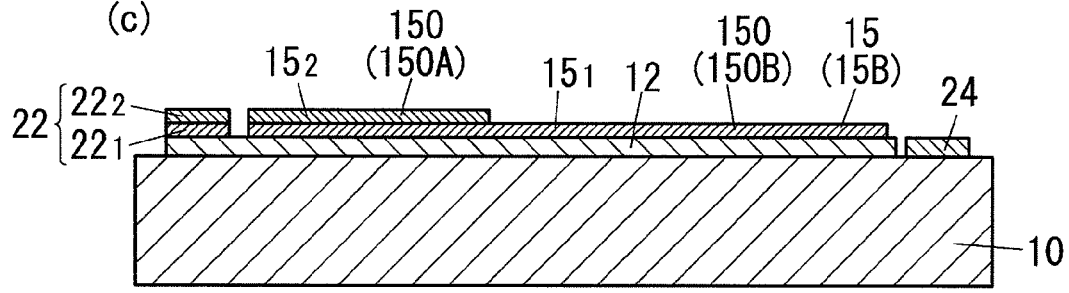

The following explanation referring to FIG. 3 is made to the organic EL element of the present embodiment.

The organic EL element of the present embodiment has a basic configuration approximately same as that of the first embodiment. However, for example, the organic EL element of the present embodiment is different from the first embodiment in that the auxiliary electrode 15 (15B) has a laminated structure of two auxiliary electrode layers $15_1$ and $15_2$ and the thickness of the auxiliary electrode 15 (15B) is varied by shortening a distance between one end close to the first terminal part 22 and another end closed to the second terminal part 24 with regard to the auxiliary electrode layer $15_2$ away from the first electrode 12 in the thickness direction of the first electrode 12. Note that, components of the present embodiment same as those of the first embodiment are designated by the same reference numerals and explanations thereof are deemed unnecessary.

It is sufficient that the auxiliary electrode 15B has a laminated structure of at least two auxiliary electrode layers $15_1$ and $15_2$. Further, it is sufficient that the thickness of the auxiliary electrode 15B is varied by more shortening a distance between one end close to the first terminal part 22 and another end closed to the second terminal part 24 with regard to the auxiliary electrode layer $15_n$ (n is equal to 2 or more) further from the first electrode 12 in the thickness direction of the first electrode 12.

The auxiliary electrode 15B is constituted by the two auxiliary electrode layers $15_1$ and $15_2$. The auxiliary electrode layer $15_1$ is formed directly on the first electrode 12. The auxiliary electrode layer $15_2$ is formed on the auxiliary electrode layer $15_1$. In this regard, an end (left end in FIG. 3(c)) of the auxiliary electrode layer $15_2$ close to the first terminal part 22 is aligned with an end (left end in FIG. 3(c)) of the auxiliary electrode layer $15_1$ close to the first terminal part 22.

As mentioned above, the auxiliary electrode 15B is constituted by the plural auxiliary electrode layers $15_n$ having the different lengths, the plural auxiliary electrode layers $15_n$ being stacked on the first electrode 12 in descending order of length while the ends (left ends in FIG. 3(c)) of the plural auxiliary electrode layers $15_n$ close to the first terminal part 22 are aligned with each other.

In the present embodiment, the auxiliary electrode layer $15_2$ and a part of the auxiliary electrode layer $15_1$ overlapped with the auxiliary electrode layer $15_2$ constitute the first portion 150A. The thickness of the first portion 150A is equal to a total of the thicknesses of the two auxiliary electrode layers $15_1$ and $15_2$. Further, a part of the auxiliary electrode layer $15_1$ which is not overlapped with the auxiliary electrode layer $15_2$ defines the second portion 150B. The thickness of the second portion 150B is equal to the thickness of the auxiliary electrode layer $15_1$.

The lengths and thicknesses of the two auxiliary electrode layers $15_1$ and $15_2$ are selected such that the inclination of the voltage of the auxiliary electrode 15B (the voltage developed at the auxiliary electrode 15B when the driving voltage is applied between the first terminal part 22 and the second terminal part 24) to the distance from the first terminal part 22 is kept constant.

The auxiliary electrode layers $15_1$ and $15_2$ may be made of different materials selected from the materials available for the auxiliary electrode 15B described in the first embodiment.

Further, in the organic EL element of the present embodiment, the first terminal part 22 has a laminated structure of two electrode layers $22_1$ and $22_2$. Furthermore, the electrode layer $22_1$ close to the first electrode 12 in the thickness direction of the first electrode 12 is made of the same material as the auxiliary electrode layer $15_1$, and the electrode layer $22_2$ far from the first electrode 12 in the thickness direction of the first electrode 12 is made of the same material as the auxiliary electrode layer $15_2$. Hence, also in the organic EL element of the present embodiment, like the organic EL element of the first embodiment, the first terminal part 22 and the auxiliary electrode 15B can be formed simultaneously.

Figure 4:
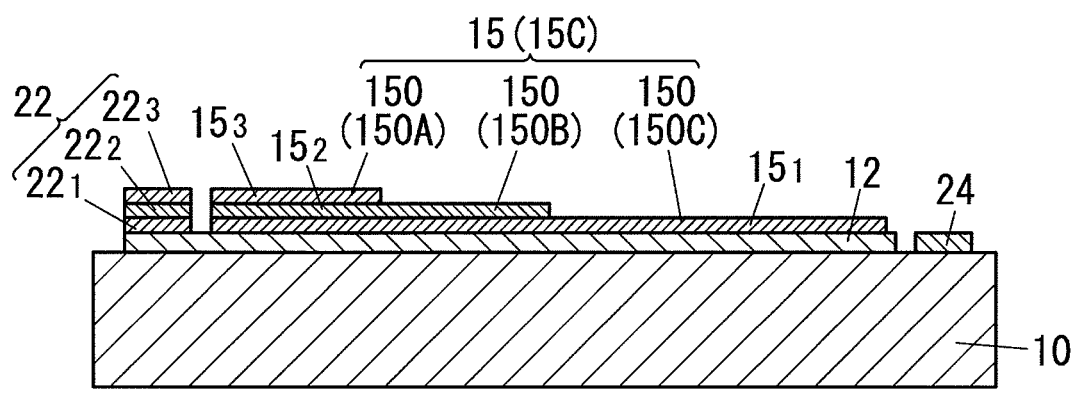
FIG. 4 is a schematic section view illustrating a modification of the organic electroluminescence element of the first embodiment.
Figure 5:
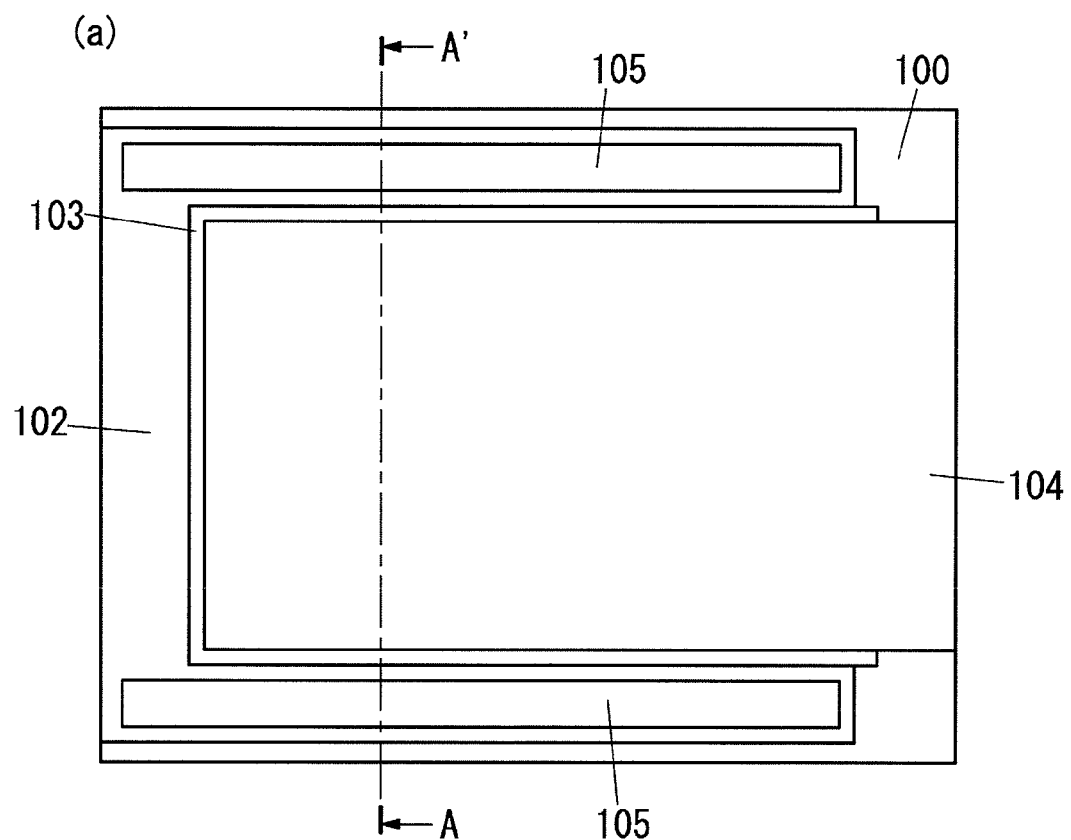
FIG. 5 relates to the organic electroluminescence element of the prior instance, and shows (a) a schematic plan view thereof, and (b) a schematic sectional view along line A-A' in (a).
Figure 5:
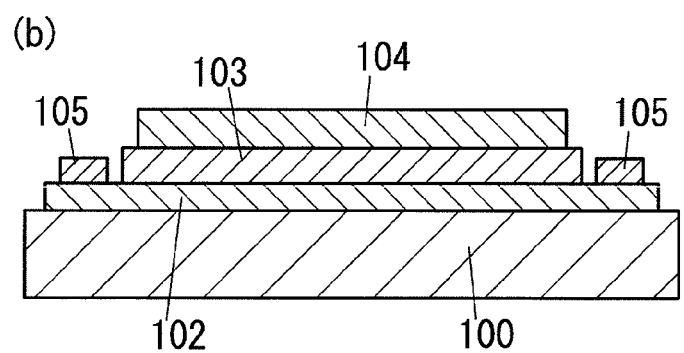

FIG. 4 shows a modification of the organic EL element of the present embodiment. The modification shown in FIG. 4 is different from the organic EL element shown in FIG. 3 in the auxiliary electrode 15 (15C). Like the auxiliary electrode 15A, the auxiliary electrode 15C includes the three portions 150 (the first portion 150A, the second portion 150B, and the third portion 150C) with the different thicknesses.

The auxiliary electrode 15C is constituted by the three auxiliary electrode layers $15_1$, $15_2$, and $15_3$. The auxiliary electrode layer $15_1$ is formed directly on the first electrode 12. The auxiliary electrode layer 152 is formed on the auxiliary electrode layer $15_1$. The auxiliary electrode layer $15_3$ is formed on the auxiliary electrode layer $15_2$. The ends (left ends in FIG. 4(c)) of the respective auxiliary electrode layer $15_2$ and $15_3$ close to the first terminal part 22 is aligned with the end (left end in FIG. 4(c)) of the auxiliary electrode layer $15_1$ close to the first terminal part 22.

As mentioned above, the auxiliary electrode 15C is constituted by the plural auxiliary electrode layers $15_n$ having the different lengths, the plural auxiliary electrode layers $15_n$ being stacked on the first electrode 12 in descending order of length while the ends (left ends in FIG. 3(c)) of the plural auxiliary electrode layers $15_n$ close to the first terminal part 22 are aligned with each other.

In the auxiliary electrode 15C, the first portion 150A is constituted by: the auxiliary electrode layer $15_3$; a part of the auxiliary electrode layer $15_2$ overlapped with the auxiliary electrode layer $15_3$; and a part of the auxiliary electrode layer $15_1$ overlapped with the auxiliary electrode layer $15_3$. The thickness of the first portion 150A is equal to a total of the thicknesses of the three auxiliary electrode layers $15_1$, $15_2$, and $15_3$.

Further, the second portion 150B is constituted by: a part of the auxiliary electrode layer $15_2$ which is not overlapped with the auxiliary electrode layer $15_3$; and a part of the auxiliary electrode layer $15_1$ which is overlapped with the auxiliary electrode layer $15_2$ but is not overlapped with the auxiliary electrode layer $15_3$. The thickness of the second portion 150B is equal to a total of the thicknesses of the two auxiliary electrode layers $15_1$ and $15_2$.

Furthermore, the third portion 150C is defined by a part of the auxiliary electrode layer 15₁ which is not overlapped with the auxiliary electrode layer 15₂. The thickness of the third portion 150C is equal to the thickness of the auxiliary electrode layer 15₁.

The lengths and thicknesses of the three auxiliary electrode layers 15₁, 15₂, and 15₃ are selected such that the inclination of the voltage of the auxiliary electrode 15C (the voltage developed at the auxiliary electrode 15C when a driving voltage is applied between the first terminal part 22 and the second terminal part 24) to the distance from the first terminal part 22 is kept constant.

Note that, in FIG. 4, the first terminal part 22 is constituted by the three electrode layers 22₁, 22₂, and 22₃. The electrode layers 22₁, 22₂, and 22₃ are made of the same materials as the auxiliary electrode layers 15₁, 15₂, and 15₃, respectively. Hence, the first terminal part 22 and the auxiliary electrode 15C can be formed simultaneously.

As mentioned above, in the organic EL element of the present embodiment, the auxiliary electrode 15 has a laminated structure of at least two auxiliary electrode layers 15$_n$. Further, the thickness of the auxiliary electrode 15 is varied by more shortening a distance between one end close to the first terminal part 22 and another end closed to the second terminal part 24 with regard to the auxiliary electrode layer 15$_n$ further from the first electrode 12 in the thickness direction of the first electrode 12.

In other words, in the organic EL element of the present embodiment, the auxiliary electrode 15 is constituted by the plural auxiliary electrode layers 15$_n$ having the different lengths, the plural auxiliary electrode layers 15$_n$ being stacked on the first electrode 12 in descending order of length while the ends (left ends in FIG. 3) of the plural auxiliary electrode layers 15$_n$ close to the first terminal part 22 are aligned with each other.

Like the organic EL element of the present embodiment, the organic EL element of the present embodiment mentioned above is capable of decreasing the area of the non-light emission part yet suppressing unevenness of luminance.

Further, in the organic EL element of the present embodiment, the auxiliary electrode 15 (15B, 15C) has a laminated structure of at least two auxiliary electrode layers 15₁ and 15₂. Further, the thickness of the auxiliary electrode 15 is varied by more shortening a distance between one end close to the first terminal part 22 and another end closed to the second terminal part 24 with regard to the auxiliary electrode layer 15$_n$ (n is equal to 2 or more) further from the first electrode 12 in the thickness direction of the first electrode 12. Hence, in contrast to the first embodiment, it is possible to facilitate forming the auxiliary electrode 15 (15B, 15C) with desired resistance distribution.

In the organic EL elements described in the first and second embodiments, the first electrode 12 formed of an transparent conductive film serves as the anode, and the second electrode 14 which has the smaller sheet resistance than that of the first electrode 12 serves as the cathode. However, the first electrode 12 and the second electrode 14 may serve as the cathode and the anode, respectively. Either case can be available so long as emission of light through the first electrode 12 formed of a transparent conductive film is allowed.

For example, the organic EL elements described in the first and second embodiments are preferably available for organic EL elements for lighting use. However, the organic EL elements described in the first and second embodiments are not limited to lighting use but may be available for other use.

The invention claimed is:

1. An organic electroluminescence element comprising:
   a first electrode made of an electrically conductive and light transmissive material;
   a light emitting layer formed on the first electrode by use of an organic material;
   a second electrode formed on the light emitting layer by use of an electrically conductive material;
   a first terminal part which is placed on a first end of the light emitting layer in a first direction crossing a thickness direction of the light emitting layer and is electrically coupled to the first electrode;
   a second terminal part which is placed on a second end of the light emitting layer in the first direction and is electrically coupled to the second electrode; and
   an auxiliary electrode which is formed on the first electrode so as to be located beside the light emitting layer in a second direction crossing the thickness direction and the first direction and is electrically coupled to the first electrode,
   wherein:
   the auxiliary electrode is formed into an elongated shape extending in the first direction by use of a material having a specific resistance smaller than that of the first electrode; and
   the auxiliary electrode includes plural portions with different thicknesses such that a sheet resistance is increased with an increase in a distance from the first terminal part in a lengthwise direction of the auxiliary electrode.

2. The organic electroluminescence element as set forth in claim 1, wherein
   the auxiliary electrode is constituted by plural auxiliary electrode layers having different lengths, the plural auxiliary electrode layers being stacked on the first electrode in descending order of length while ends of the plural auxiliary electrode layers close to the first terminal part are aligned with each other.

3. The organic electroluminescence element as set forth in claim 1, wherein
   the plural portions are arranged from the first terminal part to the second terminal part in descending order of thickness.

4. The organic electroluminescence element as set forth in claim 1, wherein
   lengths and thicknesses of the plural portions are selected such that inclination of a voltage of the auxiliary electrode to a distance from the first terminal part is kept constant.

5. The organic electroluminescence element as set forth in claim 2, wherein
   lengths and thicknesses of the plural portions are selected such that inclination of a voltage of the auxiliary electrode to a distance from the first terminal part is kept constant.

6. The organic electroluminescence element as set forth in claim 3, wherein
   lengths and thicknesses of the plural portions are selected such that inclination of a voltage of the auxiliary electrode to a distance from the first terminal part is kept constant.

* * * * *